(12) United States Patent
Kim (10) Patent No.: US 11,545,378 B2
(45) Date of Patent: Jan. 3, 2023

(54) LEAK DETECTION APPARATUS AND METHOD AND WAFER ELECTROPLATING METHOD

(71) Applicant: CHANGXIN MEMORY TECHNOLOGIES, INC., Hefei (CN)

(72) Inventor: Dongjin Kim, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 0 days.

(21) Appl. No.: 17/400,527

(22) Filed: Aug. 12, 2021

(65) Prior Publication Data

US 2022/0084855 A1 Mar. 17, 2022

Related U.S. Application Data

(63) Continuation of application No. PCT/CN2021/099880, filed on Jun. 11, 2021.

(30) Foreign Application Priority Data

Sep. 16, 2020 (CN) .......................... 202010971866.2

(51) Int. Cl.
*H01L 21/67* (2006.01)
*C25D 7/12* (2006.01)
*C25D 17/00* (2006.01)

(52) U.S. Cl.
CPC .......... *H01L 21/67288* (2013.01); *C25D 7/12* (2013.01); *C25D 17/001* (2013.01)

(58) Field of Classification Search
CPC ............ C25D 7/12–123; C25D 17/001; C25D 17/004; H01L 21/2885; H01L 21/76873
See application file for complete search history.

(56) References Cited

U.S. PATENT DOCUMENTS

| 6,139,712 A * | 10/2000 | Patton .................... C25D 7/123 |
| | | 205/137 |
| 6,156,167 A | 12/2000 | Patton |
| 6,343,793 B1 | 2/2002 | Patton |
| 6,436,249 B1 | 8/2002 | Patton |
| 6,589,401 B1 | 7/2003 | Patton |
| 6,958,113 B2 | 10/2005 | Mizohata |

(Continued)

FOREIGN PATENT DOCUMENTS

| CN | 1508296 A | 6/2004 |
| CN | 1632914 A | 6/2005 |

(Continued)

OTHER PUBLICATIONS

Supplementary European Search Report in the European application No. 21783382.1, dated Jun. 30, 2022, 9 pgs.

*Primary Examiner* — Ho-Sung Chung
(74) *Attorney, Agent, or Firm* — Cooper Legal Group, LLC (57) ABSTRACT

A leak detection apparatus and method and a wafer electroplating method are provided. An air tightness state of a reaction chamber in a wafer electroplating device is detected in advance before a wafer electroplating process is performed, namely whether leak occurs at the reaction chamber is judged by inputting a detection gas to the reaction chamber and detecting a gas pressure value of the detection gas, and whether to perform the wafer electroplating process is determined according to a judgment result.

8 Claims, 4 Drawing Sheets

(56) References Cited

U.S. PATENT DOCUMENTS

| | | |
|---|---|---|
| 9,228,270 B2 | 1/2016 | Feng |
| 9,340,891 B2 | 5/2016 | Minami et al. |
| 9,611,563 B2 | 4/2017 | Minami et al. |
| 9,812,344 B2 | 11/2017 | Rye et al. |
| 10,309,030 B2 | 6/2019 | Minami et al. |
| 10,435,807 B2 | 10/2019 | Feng et al. |
| 10,641,677 B2 | 5/2020 | Minami et al. |
| 2004/0118676 A1 | 6/2004 | Mizohata |
| 2013/0042454 A1 | 2/2013 | Feng |
| 2013/0255360 A1 | 10/2013 | Minami et al. |
| 2013/0334052 A1* | 12/2013 | Chua .................. C25D 21/06 204/252 |
| 2016/0186355 A1 | 6/2016 | Feng et al. |
| 2016/0222540 A1 | 8/2016 | Minami et al. |
| 2016/0225656 A1 | 8/2016 | Rye et al. |
| 2017/0159203 A1 | 6/2017 | Minami et al. |
| 2018/0135198 A1 | 5/2018 | Ogata et al. |
| 2019/0249325 A1 | 8/2019 | Minami et al. |
| 2019/0252213 A1* | 8/2019 | Koizumi .............. C25D 17/001 |
| 2020/0010972 A1 | 1/2020 | Ogata et al. |
| 2020/0209099 A1* | 7/2020 | Suzuki .................. C25D 17/06 |
| 2021/0198800 A1 | 7/2021 | Ogata et al. |

FOREIGN PATENT DOCUMENTS

| | | |
|---|---|---|
| CN | 102953104 A | 3/2013 |
| CN | 103361695 A | 10/2013 |
| CN | 101798698 B | 1/2014 |
| CN | 107210256 A | 9/2017 |
| CN | 110484958 A | 11/2019 |
| EP | 1133786 A2 | 9/2001 |

* cited by examiner

LEAK DETECTION APPARATUS AND METHOD AND WAFER ELECTROPLATING METHOD

CROSS-REFERENCE TO RELATED APPLICATIONS

This is a continuation application of International Patent Application No. PCT/CN2021/099880, filed on Jun. 11, 2021, which claims priority to Chinese Patent Application No. 202010971866.2, filed on Sep. 16, 2020 and entitled "LEAK DETECTION APPARATUS AND METHOD AND WAFER ELECTROPLATING METHOD". The disclosures of International Patent Application No. PCT/CN2021/099880 and Chinese Patent Application No. 202010971866.2 are hereby incorporated by reference in their entireties.

TECHNICAL FIELD

The application relates to the field of manufacturing of semiconductor devices, and particularly a leak detection apparatus and method and a wafer electroplating method.

BACKGROUND

In a manufacturing process of a semiconductor device, electroplating is a common method for depositing a metal film on a substrate. Particularly in an advanced packaging technology, electroplating is usually adopted to form copper columns, welding spots, etc., on substrates to allow the interconnection between chip substrates. Electroplating has the advantages of simple process, low cost, ease of batch production, etc.

In batch production of wafer-level packaging, wafer electroplating is an important process step for chip manufacturing. For example, in a horizontal electroplating manner, a wafer is usually arranged horizontally, each position on a surface to be electroplated is at the same depth in an electroplating solution. The pressure at each position of the surface to be electroplated is the same, and the electroplating uniformity is high. However, for the horizontal electroplating manner, relatively high requirements on, for example, the placement flatness of the wafer and air tightness of the electroplating device are made to a horizontal electroplating device. For example, abrasions or losses, caused by natural heating or forced heating, of some sealing components in the horizontal electroplating device may cause leak and other phenomena, and consequently, the electroplating solution originally at a front surface of the wafer may be leaked to a back surface of the wafer, which causes pollution on the wafer, and/or damage of electroplating device, etc.

SUMMARY

The application discloses a leak detection method for a wafer electroplating device, which may include the following operations.

A wafer to be electroplated is placed in a reaction chamber of the wafer electroplating device, and the reaction chamber is closed off, the wafer having an electroplate surface and a supporting surface opposite to the electroplate surface, and the placed wafer dividing the reaction chamber into a first chamber in which the electroplate surface is located and a second chamber in which the supporting surface is located.

A detection gas is introduced to the second chamber, and a gas pressure value in the second chamber is detected.

The detected gas pressure value in the second chamber is compared with a gas pressure reference value to determine whether leak occurs at the second chamber.

The application also discloses a wafer electroplating method applied to a wafer electroplating device, which may include the following operations.

A wafer to be electroplated is placed in a reaction chamber of the wafer electroplating device, and the reaction chamber is closed off, the wafer having an electroplate surface and a supporting surface opposite to the electroplate surface, the placed wafer dividing the reaction chamber into a first chamber in which the electroplate surface is located and a second chamber in which the supporting surface is located, and an electroplating solution being contained in the first chamber.

A detection gas is introduced to the second chamber, and a gas pressure value in the second chamber is detected.

The detected gas pressure value in the second chamber is compared with a gas pressure reference value to determine whether leak occurs at the second chamber.

Responsive to determining that leak occurs at the second chamber, the operation of the wafer electroplating device is suspended, and responsive to determining that leak does not occur at the second chamber, an electroplating process is performed on the electroplate surface of the wafer by the wafer electroplating device.

The application also discloses a leak detection apparatus for a wafer electroplating device. A reaction chamber in the wafer electroplating device is divided by the placed wafer into a first chamber in which an electroplate surface of a wafer is located and a second chamber in which a supporting surface of the wafer is located. The leak detection apparatus includes a gas transfer channel, a gas input member, and a gas pressure detection member.

The gas transfer channel may be in communication with the second chamber, and may have a gas inlet and a gas outlet.

The gas input member may be connected with the gas inlet of the gas transfer channel, and may be configured to input a detection gas to the second chamber through the gas inlet.

The gas pressure detection member may be connected with the gas outlet of the gas transfer channel, and may be configured to detect gas pressure in the second chamber.

BRIEF DESCRIPTION OF THE DRAWINGS

Specific features of the disclosure involved in the application are presented in the appended claims. The features and advantages of the disclosure involved in the application may be understood better with reference to the exemplary implementation modes described below in detail and the drawings. It is to be understood that the following drawings only illustrate some embodiments of the application and thus should not be considered as limits to the scope. Those of ordinary skill in the art may also obtain other related drawings according to these drawings without creative work. The drawings are briefly described as follows.

DETAILED DESCRIPTION

The implementations of the application will be described below with specific embodiments. Those skilled in the art may easily understand the other advantages and effects of the application from the contents disclosed in the specification.

In the following descriptions, a plurality of embodiments of the application are described with reference to the drawings. It is to be understood that other embodiments may also be used, and changes in composition and operation may be made without departing from the spirit and scope of the disclosure. The following detailed descriptions should not be considered as limitations, and the scope of the embodiments of the application is only defined by the claims of the patent application. Terms are used herein not to limit the application but only to describe specific embodiments.

Although terms first, second, etc., in some instances are used to describe various elements herein, these elements should not be limited to these terms. These terms are only used to distinguish one element from another element. For example, a first chamber may be called a second chamber, and similarly, the second chamber may be called the first chamber, without departing from the scope of various described embodiments.

Moreover, as used herein, singular forms "a/an", "one", and "the" are intended to include plural forms, unless indicated contrarily in the context. It is to be further understood that terms "contain" and "include" represent existence of a feature, step, operation, element, component, item, category, and/or group, but does not exclude existence, appearance, or addition of one or more other features, steps, operations, elements, components, items, categories, and/or groups. Terms "or" and "and/or" used here are explained as inclusion or mean any one or any combination.

In general, in wafer electroplating, electroplating is only required to be performed on a front surface of a wafer (a conducting layer and another pattern layer are formed on the front surface of the wafer), and electroplating is not required to be performed on a back surface of the wafer. At present, wafer electroplating manners may include horizontal electroplating manners and vertical electroplating manners.

Figure 1:
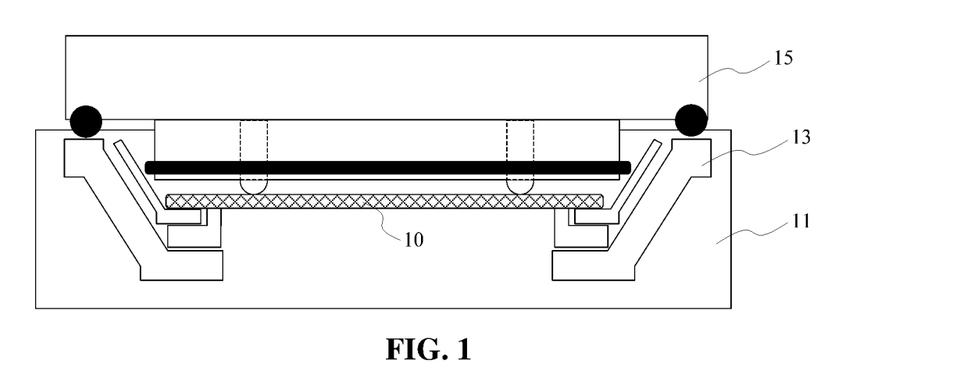
FIG. 1 is a view of a horizontal wafer electroplating device according to a related art.

References are made to FIG. 1 which is a view of a horizontal wafer electroplating device according to the related art. As shown in FIG. 1, the horizontal wafer electroplating device includes an electroplating tank 11, a wafer carrier structure 13, and a cover 15. A reaction chamber is formed in the electroplating tank 11, and the reaction chamber may contain an electroplating solution. The wafer carrier structure 13 is configured to carry a wafer 10 to be electroplated. When the wafer 10 to be electroplated is horizontally placed on the wafer carrier structure 13, a front surface of the wafer 10 (the front surface of the wafer is called an electroplate surface in the following description) faces down, and a back surface of the wafer 10 (the back surface of the wafer is called a supporting surface) faces up. In other word, the electroplate surface faces towards a bottom of the reaction chamber and the supporting surface faces towards a top of the reaction chamber. The placed wafer 10 may divide the original reaction chamber into a first chamber in which the electroplate surface is located and a second chamber in which the supporting surface is located. Apparently, the electroplating solution is in the first chamber. In addition, the wafer carrier structure 13 is provided with a hollow region, so that the electroplate surface of the wafer 10 may be exposed to the electroplating solution thereunder.

When an electroplating process is implemented on the wafer using the horizontal wafer electroplating device, air tightness of the reaction chamber is required to be ensured. Particularly for the first chamber in which the electroplating solution is located, the electroplating solution in the second chamber is required to be prevented from being leaked to the second chamber, which causes the pollution on the supporting surface of the wafer and even the damage of the wafer and the horizontal wafer electroplating device, etc. However, abrasions or losses, caused by natural heating or forced heating, of some sealing components in the horizontal wafer electroplating device may cause leak and other phenomena. Therefore, it is desirable to propose a solution to detect whether leak occurs at the reaction chamber.

In view of this, the application discloses a leak detection apparatus and method and a wafer electroplating method. After an existing wafer electroplating device is reconstructed, an air tightness state of a reaction chamber in the wafer electroplating device may be detected in advance by a leak detection apparatus before a wafer electroplating process is performed, and whether to perform the wafer electroplating process is determined according to the air tightness state, so that the problems of pollution on the wafer, damage to the electroplating device, etc., caused by leak when the wafer electroplating process is executed may be solved.

The application discloses a wafer electroplating device and a leak detection apparatus thereof. An air tightness state of a reaction chamber in the wafer electroplating device may be detected in advance using the leak detection apparatus before a wafer electroplating process is executed such that the wafer electroplating device determines whether to execute the wafer electroplating process according to a detection result of the leak detection apparatus.

In some embodiments of the application, the wafer electroplating device includes an electroplating tank, a wafer carrier structure, a cover, and the leak detection apparatus.

The reaction chamber configured to contain an electroplating solution is formed in the electroplating tank.

The wafer carrier structure is configured to carry a wafer to be electroplated. The wafer carrier structure is provided with a hollowed region for exposing an electroplate surface of the wafer to the electroplating solution.

The cover is configured to be capped on the electroplating tank to close the reaction chamber after the wafer is placed on the wafer carrier structure. The placed wafer divides the reaction chamber into a first chamber in which the electroplate surface is located and a second chamber in which a supporting surface is located. The electroplating solution is in the first chamber.

The leak detection apparatus is configured to detect whether leak occurs at the second chamber.

As such, whether leak occurs at the second chamber may be detected using the leak detection apparatus in the wafer electroplating device of the application. If the leak detection apparatus detects that leak does not occur to the second chamber, it indicates that the second chamber is sealed and isolated from the first chamber. If it is detected that leak occurs at the second chamber, it indicates that the second chamber may not be sealed and isolated from the first chamber, and there is a risk that the electroplating solution or related gas in the chamber spills to the second chamber when the electroplating process is implemented on the wafer. In such case, operation of the wafer electroplating device may be suspended until a leak hidden danger is eliminated.

A horizontal wafer electroplating device is taken as an example. In the horizontal wafer electroplating device, the wafer is horizontally placed, and the supporting surface and electroplate surface of the wafer are on upper and lower sides of the wafer respectively. In a vertical wafer electroplating device, the wafer is vertically placed, and the supporting surface and electroplate surface of the wafer on left and right sides of the wafer respectively. Compared with the vertical wafer electroplating device, the horizontal wafer electroplating device is used increasingly.

Detailed descriptions will be made in the following embodiments taking a horizontal wafer electroplating device as an example.

Figure 2:
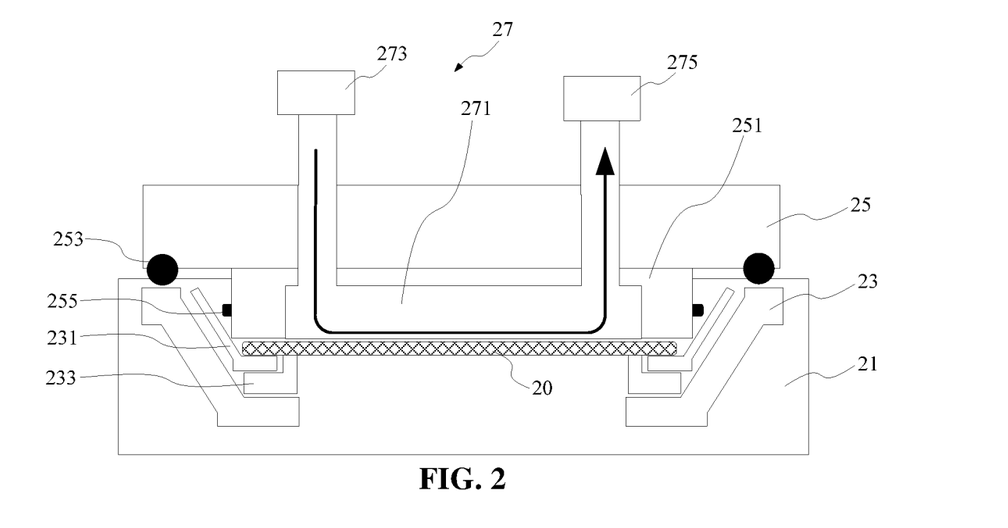
FIG. 2 is a view of a wafer electroplating device of some embodiments in the application.

Referring to FIG. 2 which is a structure diagram of a wafer electroplating device of the application in some embodiment, the wafer electroplating device includes an electroplating tank 21, a wafer carrier structure 22, a cover 25, and a leak detection apparatus 27.

The reaction chamber configured to contain an electroplating solution is formed in the electroplating tank. As shown in FIG. 2, the reaction chamber is formed in the electroplating tank 21, and the reaction chamber has a certain containing space. In practice, the electroplating solution may be contained in the containing space of the reaction chamber. In some embodiments of the application, the electroplating solution may include copper sulfate, a sulfuric acid, etc.

In addition, an electroplating anode may be arranged at a bottom of the reaction chamber.

The wafer carrier structure is configured to carry a wafer to be electroplated. As shown in FIG. 2, the wafer carrier structure 23 is arranged in the reaction chamber, and is configured to carry the wafer 20 to be electroplated. For a horizontal wafer electroplating device, the wafer carrier structure 23 forms a horizontal carrying surface, configured to carry the wafer 20 to be electroplated to ensure that the wafer 20 is horizontally placed. For ensuring that an electroplating process may be performed on the wafer, in some embodiments of the application, the wafer carrier structure 23 is provided with a hollowed region for exposing an electroplate surface of the wafer 20 to the electroplating solution. In practical applications, the wafer carrier structure 23 is provided with a hollowed region having a circular cross section to match the wafer, and the wafer carrier structure 23 supports an edge portion of the wafer 20. As such, when the wafer 20 to be electroplated is placed on the wafer carrier structure 23 with the electroplate surface thereof facing the wafer carrier structure 23, the wafer 20 is in a horizontal state, and the wafer 20 divides the reaction chamber into a first chamber (also called a lower chamber) in which the electroplate surface is located and a second chamber (also called an upper chamber) in which a supporting surface is located. The electroplating solution is in the first chamber. The electroplate surface of the wafer 20 is exposed to the electroplating solution in the first chamber except for an edge of the wafer 20 in contact with the wafer carrier structure 23.

For improving the tightness of the first chamber after the wafer 20 is placed on the wafer carrier structure 23, the wafer carrier structure 23 may also be provided with a corresponding sealing component. For example, in some embodiments of the application, the sealing component may include a contact strip and a lip seal. The contact strip 231 is arranged between the wafer 20 and the wafer carrier structure 23, and the lip seal 233 is arranged between the contact strip 231 and the wafer carrier structure 23. Therefore, the tightness of the first chamber in which the electroplate surface of the wafer 20 and the electroplating solution are located is ensured.

The cover is configured to be capped on the electroplating tank to close off the reaction chamber after the wafer is placed on the wafer carrier structure. As shown in FIG. 2, a pressing structure 251 is arranged on the cover 25. When the cover 25 is capped on the electroplating tank 21, the pressing structure 251 may contact with and press against the wafer 20 on underside thereof. The wafer 20 may be brought into close contact with the wafer carrier structure 23 under the wafer under the action of the pressure of the pressing structure 251 to improve the tightness of the first chamber. In the embodiments of the application, the pressing structure 251 may be, for example, a cylindrical cone structure. A size of the cone structure is matched with a size of the wafer, and a portion of the cone structure in contact with the wafer may be rounded.

In addition, in some embodiments of the application, the cover 25 may further include a pressing component (not shown in FIG. 2, please referring to FIG. 1) arranged on the pressing structure 251. The pressing component may be, for example, an elastic pressing element. In some embodiments of the application, the elastic pressing element includes a pressing rod with an elastic element. A mounting hole is formed in the pressing structure 251. The pressing rod and the elastic element are arranged in the mounting hole. The pressing rod protrudes from the pressing structure 251, and may extend and retract under the action of the elastic element. The elastic element includes a spring, or a connecting piece made from a resilient flexible material. The spring is, for example, but not limited to, a compression spring, a flexural spring, or a leaf spring. There may be multiple elastic pressing elements, and the elastic pressing elements are uniformly distributed on the pressing structure 251.

It can be understood that, when the cover 25 is capped on the electroplating tank 21, the elastic pressing element on the pressing structure 251 presses against the wafer 20 under the action of the pressing structure 251, such that the wafer 20 is brought into close contact with the wafer carrier structure 23 under the wafer under the action of the pressure of the pressing structure 251 and the elastic pressing element thereof, to improve the tightness of the first chamber. The elastic pressing element also provides a movement margin of the wafer 20 under the action of the pressure, so that the wafer 20 may be protected better while improving the tightness of the first chamber.

For improving the tightness of the second chamber after the wafer 20 is placed on the wafer carrier structure 23, the cover 25 may also be provided with a corresponding sealing component. For example, in some embodiments of the application, the sealing component may include an O-shaped sealing ring 253 for the cover and an O-shaped sealing ring 255 for the pressing structure. The O-shaped sealing ring 253 for the cover is arranged on the cover. When the cover 25 is capped on the electroplating tank 21, the O-shaped sealing ring 253 for the cover is located between the cover 25 and the wafer carrier structure 23. The O-shaped sealing ring 255 for the pressing structure is arranged on the pressing structure 251. When the cover 25 is capped on the electroplating tank 21, the O-shaped sealing ring 255 for the pressing structure is located between the pressing structure 251 and the wafer carrier structure 23.

Therefore, the tightness of the second chamber in which the supporting surface of the wafer 20 is located is ensured.

The leak detection apparatus 27 is configured to detect whether leak occurs at the second chamber. As shown in FIG. 2, the leak detection apparatus 27 may include a gas transfer channel 271, a gas input member 273, and a gas pressure detection member 275.

The gas transfer channel 271 is in communication with the second chamber, and has at least one gas inlet and at least one gas outlet. In some embodiments of the application, the gas inlet and the gas outlet may be formed in the cover 25. For example, the cover 25 is provided with a gas inlet channel and a gas outlet channel. The gas inlet channel is in communication with the second chamber, and the gas outlet channel is in communication with the second chamber. In such case, the gas inlet channel, the second chamber, and the gas outlet channel may form the gas transfer channel.

The gas input member 273 is connected with the gas inlet of the gas transfer channel 271, and may be configured to input a detection gas to the second chamber through the gas inlet. In some embodiments of the application, the gas input member 273 may be, for example, a gas pump or a fan.

The gas pressure detection member 275 is connected with the gas outlet of the gas transfer channel 271, and is configured to detect gas pressure in the second chamber. In some embodiments of the application, the gas pressure detection member 275 may be, for example, a gas pressure gage. A gas pressure value in the second chamber may be obtained by the detection.

In the embodiments of the application, the leak detection apparatus of the application may be used to input a certain amount of detection gas to the second chamber, then obtain the gas pressure value in the second chamber by the detection, and compare the detected gas pressure value with a gas pressure reference value to determine whether leak occurs at the second chamber. The gas pressure reference value may be a standard gas pressure value obtained by detection after the detection gas is introduced under a standard condition (for example, the second chamber is completely airtight). In practical applications, it may be configured in such a way that, when the actual detected gas pressure value is less than the gas pressure reference value or a set proportion of the gas pressure reference value, it can be determined that leak occurs at the second chamber. The set proportion of the gas pressure reference value may be, for example, 90% or 95% of the gas pressure reference value. A specific proportion value may be correspondingly set as required by an actual application.

In some embodiments of the application, when the gas pressure value in the second chamber is detected by the gas pressure detection member 275, an engineer may compare the detected gas pressure value with the gas pressure reference value to determine whether leak occurs. For example, when the detected gas pressure value is less than the gas pressure reference value or the set proportion of the gas pressure reference value, it is determined that leak occurs at the second chamber, and in such case, the engineer may record this event and suspend the operation of the wafer electroplating device. If the detected gas pressure value is consistent with the gas pressure reference value, it is determined that air tightness of the second chamber is good, and the electroplating process may be continued to be performed on the wafer by the wafer electroplating device.

In some embodiments of the application, the leak detection apparatus may further include a processing member. The processing member is connected with the gas pressure detection member and configured to compare the detected gas pressure value in the second chamber with the gas pressure reference value to determine whether leak occurs at the second chamber. Therefore, when the detected gas pressure value is less than the gas pressure reference value or the set proportion of the gas pressure reference value, the processing member determines that leak occurs at the second chamber. In some embodiments of the application, the processing member may control an alarming member connected to the processing member to output alarm information. Alternatively, in some embodiments of the application, the processing member may control a control member connected to the processing member to suspend the operation of the wafer electroplating device. When the detected gas pressure value is consistent with the gas pressure reference value, it is determined that air tightness of the second chamber is good. In some embodiments of the application, the processing member may control the alarming member connected to the processing member to output detection success information. Alternatively, in some embodiments of the application, the processing member may control a control member connected to the processing member to control the wafer electroplating device to perform the electroplating process on the wafer.

From the above, according to the wafer electroplating device and leak detection apparatus thereof disclosed in the application, the leak detection apparatus includes the gas transfer channel, the gas input member, and the gas detection member. The detection gas is input to the gas transfer channel by the gas input member. A gas pressure value in the gas transfer channel is detected by the gas pressure detection member to judge whether leak occurs at the second chamber in communication with the gas transfer channel, so as to determine whether to continue to perform the wafer electroplating process or suspend the operation of the wafer electroplating device according to the judgment result. In this way, the problems such as pollution on the wafer, and/or damage to the horizontal electroplating device, caused by leakage of the electroplating solution during the wafer electroplating process is performed may be solved.

The application also discloses a leak detection method for the abovementioned wafer electroplating device, to detect whether leak occurs at a reaction chamber of the wafer electroplating device. References are made to FIG. 3 which is a flowchart of a leak detection method of the application in some embodiments.

Figure 3:
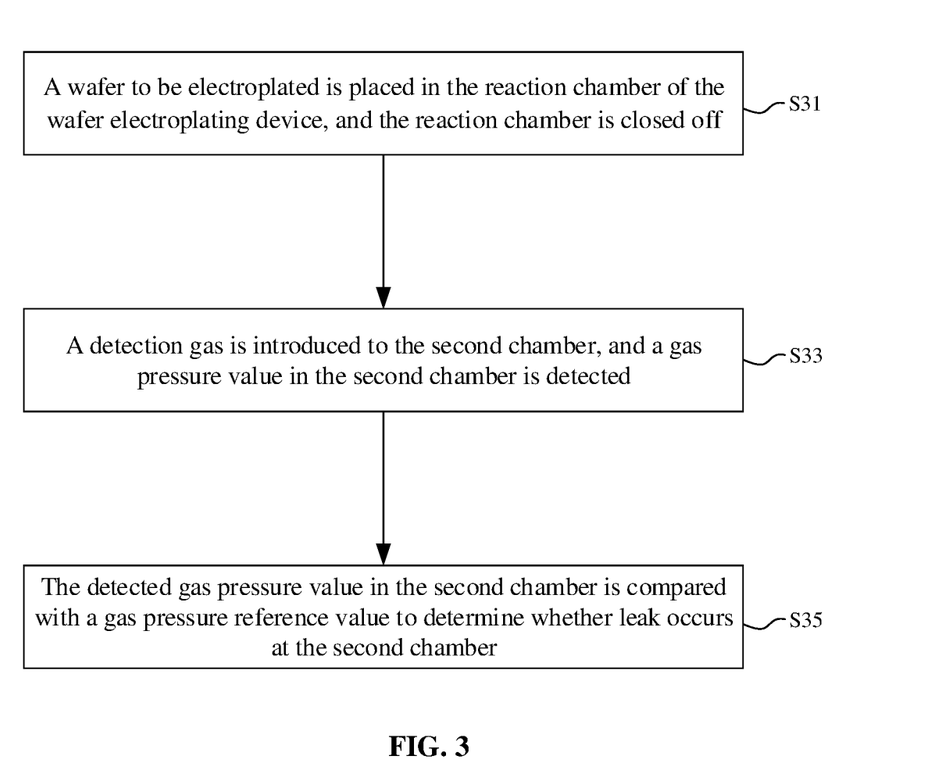
FIG. 3 is a flowchart of a leak detection method of some embodiments in the application.

In S31, a wafer to be electroplated is placed in the reaction chamber of the wafer electroplating device, and the reaction chamber is closed off.

The wafer electroplating device is provided with the reaction chamber in which an electroplating solution is contained. The wafer has an electroplate surface and a supporting surface opposite to the electroplate surface. After the wafer is placed in the reaction chamber of the wafer electroplating device, the wafer may divide the reaction chamber into a first chamber in which the electroplate surface is located and a second chamber in which the supporting surface is located. The electroplating solution is in the first chamber.

In S33, a detection gas is introduced to the second chamber, and a gas pressure value in the second chamber is detected.

In the embodiments of the application, the operation of introducing the detection gas to the second chamber and detecting the gas pressure value in the second chamber further includes that: the detection gas is introduced to the second chamber; and the gas pressure value in the second chamber is detected after the detection gas is resided in the second chamber for a period of time to become stable. The detection gas may be, for example, nitrogen.

In S35, the detected gas pressure value in the second chamber is compared with a gas pressure reference value to determine whether leak occurs at the second chamber.

In some embodiments of the application, the gas pressure reference value may be a standard gas pressure value obtained by detection after the detection gas is introduced under a standard condition (for example, the second chamber is completely airtight). In practical applications, the wafer electroplating device may be configured in such a way that, when the actually detected gas pressure value is less than the gas pressure reference value or a set proportion of the gas pressure reference value, it can be determined that leak occurs at the second chamber. The set proportion of the gas pressure reference value may be, for example, 90% or 95% of the gas pressure reference value. A specific proportion value may be correspondingly set as required by an actually application.

In some embodiments of the application, when the detected gas pressure value is less than the gas pressure reference value or the set proportion of the gas pressure reference value, the wafer electroplating device can determine that leak occurs at the second chamber. In some embodiments of the application, the wafer electroplating device may output alarm information. Alternatively, in some embodiments of the application, the wafer electroplating device may suspend the operation of the wafer electroplating device.

It can be understood that, by means of leak detection apparatus of the application, it can be judged whether leak occurs at the reaction chamber, by inputting the detection gas to the reaction chamber and detecting the gas pressure value of the detection gas, and it can be determined whether to execute a wafer electroplating process is determined according to a judgment result. In this say, the problems such as pollution to the wafer and/or damage to the horizontal electroplating device caused by leakage of the electroplating solution during the wafer electroplating process may be solved.

The application also discloses a wafer electroplating method. The wafer electroplating method is applied to a wafer electroplating device. References are made to FIG. 4 which is a flowchart of a wafer electroplating method of the application in some embodiments.

Figure 4:
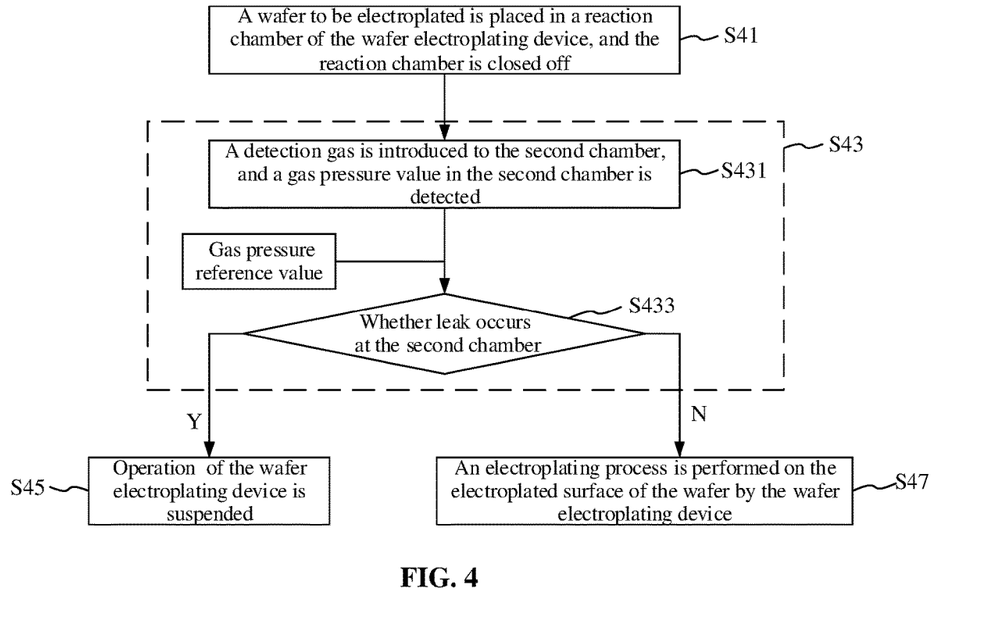
FIG. 4 is a flowchart of a wafer electroplating method of some embodiments in the application.

As shown in FIG. 4, the wafer electroplating method of the application includes the following operations.

In S41, a wafer to be electroplated is placed in a reaction chamber of the wafer electroplating device, and the reaction chamber is closed off.

In the embodiments of the application, the wafer electroplating device is provided with the reaction chamber in which an electroplating solution is contained. The wafer has an electroplate surface and a supporting surface opposite to the electroplate surface. After the wafer is placed in the reaction chamber of the wafer electroplating device, the wafer may divide the reaction chamber into a first chamber in which the electroplate surface is located and a second chamber in which the supporting surface is located. The electroplating solution is in the first chamber.

Then, the wafer electroplating device executes S43 to perform leak detection on the wafer electroplating device, to judge whether leak occurs at the reaction chamber of the wafer electroplating device.

A process of performing leak detection on the wafer electroplating device further includes S431 and S433.

In S431, a detection gas is introduced to the second chamber, and a gas pressure value in the second chamber is detected.

In the embodiments of the application, the operation of introducing the detection gas to the second chamber and detecting the gas pressure value in the second chamber further includes that: the detection gas is introduced to the second chamber; and the gas pressure value in the second chamber is detected after the detection gas is resided in the second chamber for a period of time to become stable. The detection gas may be, for example, nitrogen.

In S433, the detected gas pressure value in the second chamber is compared with a gas pressure reference value to determine whether leak occurs at the second chamber.

In some embodiments of the application, the gas pressure reference value may be a standard gas pressure value obtained by detection after the detection gas is introduced under a standard condition (for example, the second chamber is completely airtight). In practical applications, the wafer electroplating device may be configured in such a way that, when the actually detected gas pressure value is less than the gas pressure reference value or a set proportion of the gas pressure reference value, it can be determined that leak occurs at the second chamber. The set proportion of the gas pressure reference value may be, for example, 90% or 95% of the gas pressure reference value. A specific proportion value may be correspondingly set as required by an actual application.

In S45, responsive to determining that leak occurs at the second chamber, the operation of the wafer electroplating device is suspended.

In S47, responsive to determining that leak does not occur at the second chamber, an electroplating process is performed on the electroplate surface of the wafer by the wafer electroplating device.

In the embodiments of the application, an engineer may compare the detected gas pressure value with the gas pressure reference value to judge whether leak occurs. For example, when the detected gas pressure value is less than the gas pressure reference value or the set proportion of the gas pressure reference value, it is determined that leak occurs at the second chamber, and in such case, the engineer may record this event and suspend the operation of the wafer electroplating device. If the detected gas pressure value is consistent with the gas pressure reference value, it is determined that air tightness of the second chamber is good, and the electroplating process may be continued to be performed on the wafer by the wafer electroplating device.

In the embodiments of the application, the wafer electroplating device compares the detected gas pressure value in the second chamber with the gas pressure reference value to determine whether leak occurs at the second chamber. Therefore, when the detected gas pressure value is less than the gas pressure reference value or the set proportion of the gas pressure reference value, the wafer electroplating device can determine that leak occurs at the second chamber. In some implementations, the wafer electroplating device may control a corresponding alarming member to output alarm information. Alternatively, in some implementations, the operation of the wafer electroplating device may be suspended. When the detected gas pressure value is consistent with the gas pressure reference value, it is determined that air tightness of the second chamber is good. In some implementations, the wafer electroplating device may control the alarming member connected to the wafer electroplating device to output detection success information.

Alternatively, in some implementations, the wafer electroplating device performs the electroplating process on the wafer.

In some embodiments of the application, the wafer electroplating device is in communication connection with a Fault Detection and Classification (FDC) apparatus. A communication connection manner may include a wired or wireless manner. The FDC system is embedded with an FDC sensor, and a gas pressure value set in the FDC sensor is used to set interlock. The FDC sensor may include a gas pressure sensor, etc. In the embodiments of the application, the FDC sensor is also called a virtual sensor, and the created virtual sensor is registered to the FDC apparatus for real-time monitoring. In the embodiments of the application, gas pressure required to be monitored is the detected pressure in the second chamber in the wafer electroplating device. After acquiring pressure data of the second chamber, the FDC system compares the pressure data of the second chamber and gas pressure data set in the FDC sensor through the FDC sensor. When the pressure of the second chamber is lower than a preset range, the FDC apparatus generates interlock and sends a tool hold signal to the wafer electroplating device to suspend processing of the electroplating device. A user may monitor through the FDC system that an unfavorable or abnormal condition occurs at the wafer device, and then take a necessary measure, for example, maintaining the electroplating device.

Moreover, when the pressure of the second chamber is not beyond the preset range, the FDC apparatus may release interlock and send a tool run signal to the wafer electroplating device to enable the wafer electroplating device to run for processing. For example, after the wafer electroplating device returns to normal, since the pressure of the second chamber is not beyond the pressure range preset in the FDC sensor, when the FDC system sends the tool run signal, the wafer electroplating device continues running instead of suspending the operation of the wafer electroplating device.

The wafer electroplating method will be described below in detail taking using the horizontal wafer electroplating device shown in FIG. 2 as an example.

First, a wafer to be electroplated is placed.

The operation of placing the wafer to be electroplated specifically includes that: the wafer to be electroplated is horizontally placed in the reaction chamber of the wafer electroplating device with an electroplate surface facing down and a supporting surface facing up. In other word, the electroplate surface faces towards a bottom of the reaction chamber and the supporting surface faces towards a top of the reaction chamber. As such, the placed wafer divides the reaction chamber into a first chamber in which the electroplate surface is located and a second chamber which is above the first chamber and in which the supporting surface is located.

As shown in FIG. 2, the electroplating tank 21 of the wafer electroplating device is provided with the reaction chamber. An electroplating solution is contained in the reaction chamber. The electroplating solution may include copper sulfate, a sulfuric acid, etc. The wafer 20 to be electroplated is horizontally placed on the wafer carrier structure 23 of the wafer electroplating device with the electroplate surface facing down and the supporting surface facing up. In other word, the electroplate surface faces towards a bottom of the reaction chamber and the supporting surface faces towards a top of the reaction chamber. After the placement of the wafer, the horizontal wafer electroplating device close off the electroplating tank 21 by the cover 25 of the wafer electroplating device, and the cover 25 presses against the wafer 20 to keep the sealing between the wafer 20 and the wafer carrier structure 23 and between the cover 25 and the wafer carrier structure 23. As such, the wafer 20 may divide the reaction chamber into the first chamber (also called a lower chamber) in which the electroplate surface is located and the second chamber (also called an upper chamber) in which the supporting surface is located.

Then, leak detection is performed on the second chamber to determine whether leak occurs at the second chamber.

Leak detection specifically includes that: a certain amount of detection gas is input to the second chamber, and is detected to obtain a gas pressure value in the second chamber; and the detected gas pressure value is compared with a gas pressure reference value to determine whether leak occurs at the second chamber. The gas pressure reference value may be a standard gas pressure value obtained by detection after the detection gas is introduced under a standard condition (for example, the second chamber is completely airtight). In actual applications, the horizontal wafer electroplating device may be configured in such a way that, when the actually detected gas pressure value is less than the gas pressure reference value or a set proportion of the gas pressure reference value, it may be determined that leak occurs at the second chamber.

Next, a corresponding control measure is taken according to a judgment result.

The control measure is as follows. When the detected gas pressure value is less than the gas pressure reference value or a set proportion of the gas pressure reference value, it can be determined that leak occurs at the second chamber. The control measure that is taken may include outputting alarm information, suspending the operation of the wafer electroplating device, etc. When the detected gas pressure value is consistent with the gas pressure reference value, the horizontal wafer electroplating device determines that air tightness of the second chamber is good and leak does not occur. The control measure that is taken may include outputting detection success information, and performing an electroplating process on the wafer, etc.

It can be understood that, according to the wafer electroplating method and leak detection method disclosed in the application, an air tightness state of the reaction chamber in the wafer electroplating device is detected in advance before the wafer electroplating process is performed, namely whether leak occurs at the reaction chamber is judged by inputting the detection gas to the reaction chamber and detecting the gas pressure value of the detection gas, and whether to perform the wafer electroplating process is determined according to the judgment result. In this way, the problems, such as pollution to the wafer and/or damage to the horizontal electroplating device caused by leakage of the electroplating solution during the wafer electroplating process, may be solved.

The abovementioned embodiments only exemplarily describe the principle and effects of the application and are not intended to limit the application. Any person skilled in the art may make modifications or variations to the embodiments without departing from the spirit and scope of the application. Therefore, any equivalent modifications or variations made by those of ordinary skill in the art without departing from the spirit and technical idea disclosed in the application shall be covered by the claims of the application.

The invention claimed is:

1. A leak detection method for a wafer electroplating device, the wafer electroplating device comprising a cover, a pressing structure is arranged on the cover, and a gas transfer channel is formed between the pressing structure and a wafer, the leak detection method comprising:
- placing the wafer to be electroplated in a reaction chamber of the wafer electroplating device;
- closing off the reaction chamber through the cover such that the pressing structure presses against the wafer on an underside thereof to improve a tightness of a first chamber, wherein the wafer has an electroplating surface and a supporting surface opposite to the electroplating surface, and the placed wafer divides the reaction chamber into the first chamber in which the electroplating surface is located and a second chamber in which the supporting surface is located, and the gas transfer channel is in communication with the second chamber;
- introducing a detection gas to the second chamber via the gas transfer channel, and detecting a gas pressure value in the second chamber;
- comparing the detected gas pressure value in the second chamber with a gas pressure reference value to determine whether a leak is present at the second chamber; and
- responsive to determining that the leak is present at the second chamber, at least one of:
  - (a) outputting alarm information, or
  - (b) suspending operation of the wafer electroplating device.

2. The leak detection method for the wafer electroplating device of claim 1, wherein:
- the wafer electroplating device is a horizontal wafer electroplating device; and placing the wafer to be electroplated in the reaction chamber of the wafer electroplating device and closing off the reaction chamber comprises: horizontally placing the wafer to be electroplated in the reaction chamber of the wafer electroplating device with the electroplating surface facing towards a bottom of the reaction chamber and the supporting surface facing towards a top of the reaction chamber such that the placed wafer divides the reaction chamber into the first chamber in which the electroplating surface is located and the second chamber which is above the first chamber and in which the supporting surface is located.

3. The leak detection method for the wafer electroplating device of claim 1, wherein:
- introducing the detection gas to the second chamber and detecting the gas pressure value in the second chamber comprises:
  - introducing the detection gas to the second chamber; and
  - detecting the gas pressure value in the second chamber after the detection gasps resides in the second chamber for a period of time to become stable.

4. The leak detection method for the wafer electroplating device of claim 1, wherein:
- the detection gas comprises nitrogen.

5. The leak detection method for the wafer electroplating device of claim 1, wherein:
- comparing the detected gas pressure value in the second chamber with the gas pressure reference value to determine whether the leak is present at the second chamber comprises: responsive to the detected gas pressure value in the second chamber being less than the gas pressure reference value or a set proportion of the gas pressure reference value, determining that the leak is present at the second chamber.

6. A wafer electroplating method, applied to a wafer electroplating device, the wafer electroplating device comprising a cover, a pressing structure is arranged on the cover, and a gas transfer channel is formed between the pressing structure and a wafer, the wafer electroplating method comprising:
- placing the wafer to be electroplated in a reaction chamber of the wafer electroplating device;
- closing off the reaction chamber through the cover such that the pressing structure presses against the wafer on an underside thereof to improve a tightness of a first chamber, wherein the wafer has an electroplating surface and a supporting surface opposite to the electroplating surface, the placed wafer divides the reaction chamber into the first chamber in which the electroplating surface is located and a second chamber in which the supporting surface is located, an electroplating solution is contained in the first chamber, and the gas transfer channel is in communication with the second chamber;
- introducing a detection gas to the second chamber, and detecting a gas pressure value in the second chamber;
- comparing the detected gas pressure value in the second chamber with a gas pressure reference value to determine whether a leak is present at the second chamber; and
- responsive to determining that the leak is preset at the second chamber, suspending operation of the wafer electroplating device, and responsive to determining that the leak is not present at the second chamber, performing an electroplating process on the electroplating surface of the wafer by the wafer electroplating device.

7. The wafer electroplating method of claim 6, wherein:
- the wafer electroplating device is a horizontal wafer electroplating device; and placing the wafer to be electroplated in the reaction chamber of the wafer electroplating device and closing off the reaction chamber comprises: horizontally placing the wafer to be electroplated in the reaction chamber of the wafer electroplating device with the electroplating surface facing towards a bottom of the reaction chamber and the supporting surface facing towards a top of the reaction chamber such that the placed wafer divides the reaction chamber into the first chamber in which the electroplating surface is located and the second chamber which is above the first chamber and in which the supporting surface is located.

8. The wafer electroplating method of claim 6, wherein:
- comparing the detected gas pressure value in the second chamber and the gas pressure reference value to determine whether the leak is present at the second chamber comprises: responsive to the detected gas pressure value in the second chamber being less than the gas pressure reference value or a set proportion of the gas pressure reference value, determining that the leak is present at the second chamber.

* * * * *